(12) United States Patent
Malhotra et al.

(10) Patent No.: US 9,299,778 B2
(45) Date of Patent: Mar. 29, 2016

(54) CVD-FREE, SCALABLE PROCESSES FOR THE PRODUCTION OF SILICON MICRO- AND NANOSTRUCTURES

(71) Applicant: Brewer Science Inc., Rolla, MO (US)

(72) Inventors: Jyoti K. Malhotra, Rolla, MO (US); Jeff Leith, Salem, MO (US); Curtis Planje, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 14/076,094

(22) Filed: Nov. 8, 2013

(65) Prior Publication Data

US 2014/0124898 A1 May 8, 2014

Related U.S. Application Data

(60) Provisional application No. 61/724,116, filed on Nov. 8, 2012.

(51) Int. Cl.
| | |
|---|---|
| *H01L 21/00* | (2006.01) |
| *H01L 29/06* | (2006.01) |
| *H01L 21/02* | (2006.01) |
| *H01L 51/00* | (2006.01) |
| *B82Y 10/00* | (2011.01) |
| *B82Y 40/00* | (2011.01) |

(Continued)

(52) U.S. Cl.
CPC ........ *H01L 29/0676* (2013.01); *B81C 1/00111* (2013.01); *B81C 99/008* (2013.01); *B82Y 10/00* (2013.01); *B82Y 40/00* (2013.01); *G03F 1/50* (2013.01); *G03F 7/0035* (2013.01); *H01L 21/0259* (2013.01); *H01L 21/02606* (2013.01); *H01L 29/0665* (2013.01); *H01L 29/0669* (2013.01); *H01L 51/0048* (2013.01)

(58) Field of Classification Search
CPC ............ H01L 51/0048; H01L 29/0665; H01L 21/02606; H01L 29/0669; H01L 21/0259
See application file for complete search history.

(56) References Cited

U.S. PATENT DOCUMENTS

| | | | |
|---|---|---|---|
| 6,617,012 | B1 | 9/2003 | Wang et al. |
| 7,695,890 | B2 | 4/2010 | Zhong et al. |

(Continued)

FOREIGN PATENT DOCUMENTS

| | | |
|---|---|---|
| WO | 2007/030593 A1 | 3/2007 |
| WO | 2012/074363 A1 | 6/2012 |

OTHER PUBLICATIONS

Fahad et al., "Are Nanotube Architectures More Advantageous Than Nanowire Architectures for Field Effect Transistors?," Scientific Reports 2, Article No. 475, 2012, nature.com, 11 pages.

(Continued)

*Primary Examiner* — Ngan Ngo
(74) *Attorney, Agent, or Firm* — Hovey Williams LLP (57) ABSTRACT

Manufacturing-friendly and scalable methods for the production of silicon micro- and nanostructures, including silicon nanotubes, are described. The inventive methods utilize conventional integrated circuit and MEMS manufacturing processes, including spin-coating, photolithography, wet and dry silicon etching, and photoassisted electrochemical etch processes. The invention also provides a novel mask, for maximizing the number of tubes obtained per surface area unit of the silicon substrate on which the tubes are built. The resulting tubes have thick and straight outer walls, as well as high aspect ratios.

21 Claims, 6 Drawing Sheets

(51) Int. Cl.
  B81C 1/00      (2006.01)
  B81C 99/00     (2010.01)
  G03F 1/50      (2012.01)
  G03F 7/00      (2006.01)

(56) References Cited

U.S. PATENT DOCUMENTS 7,709,178 B2    5/2010  Zhong et al.
2008/0164577 A1  7/2008  Li et al.
2010/0151635 A1  6/2010  Chung

OTHER PUBLICATIONS

Chan et al., "High-performance lithium battery anodes using silicon nanowires," Nature Nanotechnology 3, 2008, 31-35.
"Fabricating and aligning silicon nanowires to investigate size dependence for quantum confinement and electronic transport analysis," http://chem.tufts.edu/PropDataBase/Jenny%20Prop, 23 pages.
Choi et al., "One-dimensional Si/Sn—based nanowires and nanotubes for lithium-ion energy storage materials," J. Mater. Chem., 2011, 21, 9825-9840.
Baggetto et al., "Honeycomb-Structured Silicon: Remarkable Morphological Changes Induced by Electrochemical (De)Lithiation," Advanced Materials, 2011, vol. 23, Issue 13, 1563-1566.
Xu et al., "Surface-modified silicon nanowire anodes for lithium-ion batteries," Journal of Power Sources, 2011, vol. 196, Issue 20, 8583-8589.
Park et al., "Silicon Nanotube Battery Anodes," Nano Letters, 2009, 9, (11), 3844-3847.
Yoo et al., "Scalable Fabrication of Silicon Nanotubes and their Application to Energy Storage," Adv. Mater., 2012, 24 (40): 5452-5456.
Zhang et al., "Fabrication and characterization of squama-shape micro/nano multi-scale silicon material," Science China Technological Sciences, Dec. 2012, vol. 55, Issue 12, 3395-3400.
Choi et al., "Fabrication of hierarchical micro/nanostructures via scanning probe lithography and wet chemical etching," Ultramicroscopy 108, 2008, 1205-1209.
Azimi et al., "Fabrication of Suspended Multilevel Three-Dimensional Silicon Micro- and Nano-Structures," NSTI-Nanotech, 2013, vol. 2, 158-161.
Bai et al., "Template-free fabrication of silicon micropillar/nanowire composite structure by one-step etching," Nanoscale Research Letters, 2012, 7(1):557, 5 pages.
Dahiya et al., "Fabrication of single crystal silicon micro-/nanostructures and transferring them to flexible substrates," Microelectronic Engineering, 2012, vol. 98, 502-507.
International Search Report and Written Opinion dated Feb. 19, 2014 in corresponding PCT/US2013/069334 filed on Nov. 8, 2013.
Chang, S., "Fabrication of high aspect ratio silicon nanostructure arrays by metal-assisted etching," Massachusetts Institute of Technology, Department of Materials Science and Engineering, 2010, 182 pages (3 page abstract only attached).
Thakur et al., "Porous Silicon: A new anode for high energy density Li-ion batteries," Rice University, Lockheed Martin Space Systems, and Lockheed Martin MS2, 23 pages.
Zhao et al., "Hierarchical micro/nano porous silicon Li-ion battery anodes," Chemical Communications, 2012, 48, 5079-5081.
Cho, J., "Porous Si anode materials for lithium rechargeable batteries," Journal of Materials Chemistry, 2010, 20, 4009-4014.
Chamran et al., "3-Dimensioncal Electrodes for Microbatteries," Proceedings of IMECE04, 2004 ASME International Mechanical Engineering Congress and Exposition, Nov. 13-20, 2004, Anaheim, CA, USA, 4 pages.
Repas, R., "Spray-on battery turns almost any surface into a power source," Rice University article, Aug. 23, 2012, machinedesign.com, 4 pages.
Wu et al., "Six Thousand Electrochemical Cycles of Double-Walled Silicon Nanotube Anodes for Lithium Ion Batteries," Stanford University and Korea Advanced Institute of Science and Technology, 16 pages.
Wu et al., "Designing nanostructured Si anodes for high energy lithium ion batteries," Nano Today 268, 2012, 16 pages.
Chang, S., "Fabrication of high aspect ratio silicon nanostructure arrays by metal-assisted etching," Massachusetts Institute of Technology, Department of Materials Science and Engineering, 2010, 182 pages.

CVD-FREE, SCALABLE PROCESSES FOR THE PRODUCTION OF SILICON MICRO- AND NANOSTRUCTURES

RELATED APPLICATIONS

This applications claims the priority benefit of U.S. Patent Application No. 61/724,116, filed Nov. 8, 2012, entitled CVD-FREE, SCALABLE PROCESSES FOR THE PRODUCTION OF SILICON NANOSTRUCTURES, incorporated by reference herein.

BACKGROUND OF THE INVENTION

1. Field of the Invention

The present invention is broadly concerned with the production of silicon micro- and nanostructures, specifically silicon micro- and nanotubes, using standard silicon processing techniques such as lithography and etching.

2. Description of the Prior Art

Silicon micro- and nanostructures (e.g., silicon nanotubes) are of interest for a number of applications, such as for use in high-tech batteries. Silicon nanostructures are being reported in the literature in laboratory-scale demonstration, but methods to fabricate them incorporate high-temperature (≥320° C.) chemical vapor deposition (CVD) or pyrolysis techniques, which are non-scalable in production. Other methods, such as metal-assisted etching and electrodeposition, require the use of block copolymers, which involve complex synthesis, making them less desirable for large scale manufacturing. Deep reactive ion etching (DRIE) methods require expensive tooling and relatively long process times to complete the manufacturing cycle and are, therefore, difficult to scale. Scanning probe lithography and focused high energy proton beam irradiation are not practical for mass production because patterning speed is slow. In order to make silicon micro- and nanostructures feasible for commercial use, simplification and scalability of their manufacture is necessary.

SUMMARY OF THE INVENTION

The present invention overcomes the problems of the prior art by providing a method of forming silicon tubes. The method comprises providing a silicon substrate having a surface, and optionally forming an intermediate layer on the surface. An etch layer of a composition is formed on the substrate surface, or on the intermediate layer, if present. An imaging layer is optionally formed on the etch layer, and the etch layer, or the imaging layer, if present, is selectively exposed to light to form bands in the etch layer or imaging layer, if present. The bands are chemically different from the remainder of the etch layer or imaging layer, if present. The etch layer or imaging layer, if present, is developed so as to remove areas of the etch layer or imaging layer, if present, yielding a pattern in the etch layer or imaging layer, if present. The pattern is transferred into the substrate so as to form silicon tubes from the substrate.

The invention is also concerned with a structure comprising a silicon substrate having a surface and a plurality of silicon tubes integrally formed on the surface of the silicon substrate.

In another embodiment of the invention, a silicon tube is provided. The tube has an average outer wall thickness of at least about 50 nm and: (1) a length of less than about 500 μm; (2) a maximum cross-sectional width of less than about 50 μm; or (3) both (1) and (2).

In a further embodiment, a novel mask for use in photolithographic processes is disclosed. The mask comprises a rigid layer and areas of a first % light transmission and areas of a second % light transmission, with the first % light transmission areas being in the form of an array of template bands.

DETAILED DESCRIPTION OF THE PREFERRED EMBODIMENTS

The Inventive Method

Figure 1:
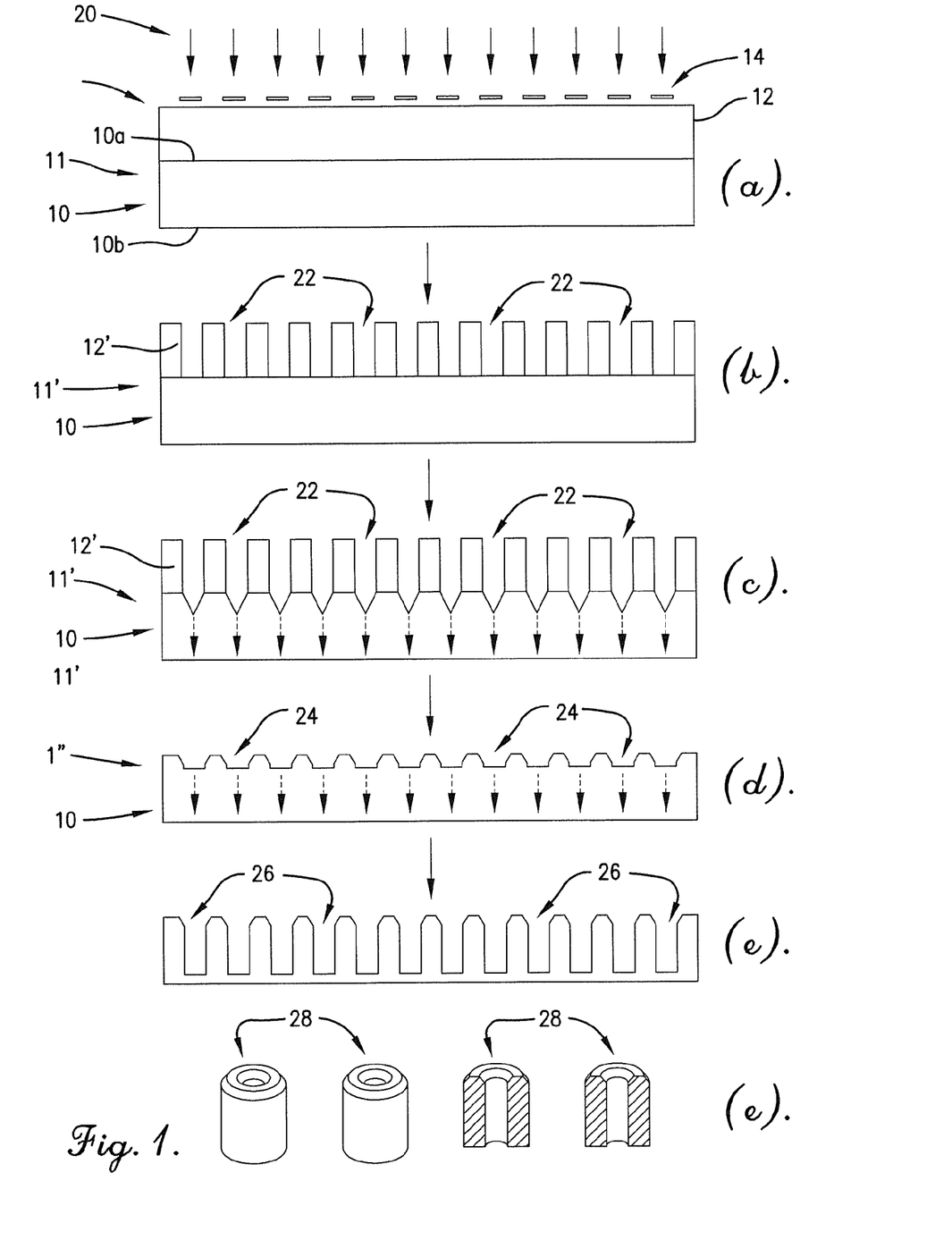
FIG. 1 is a schematic illustration (not to scale) of the inventive method.
Figure 2A:
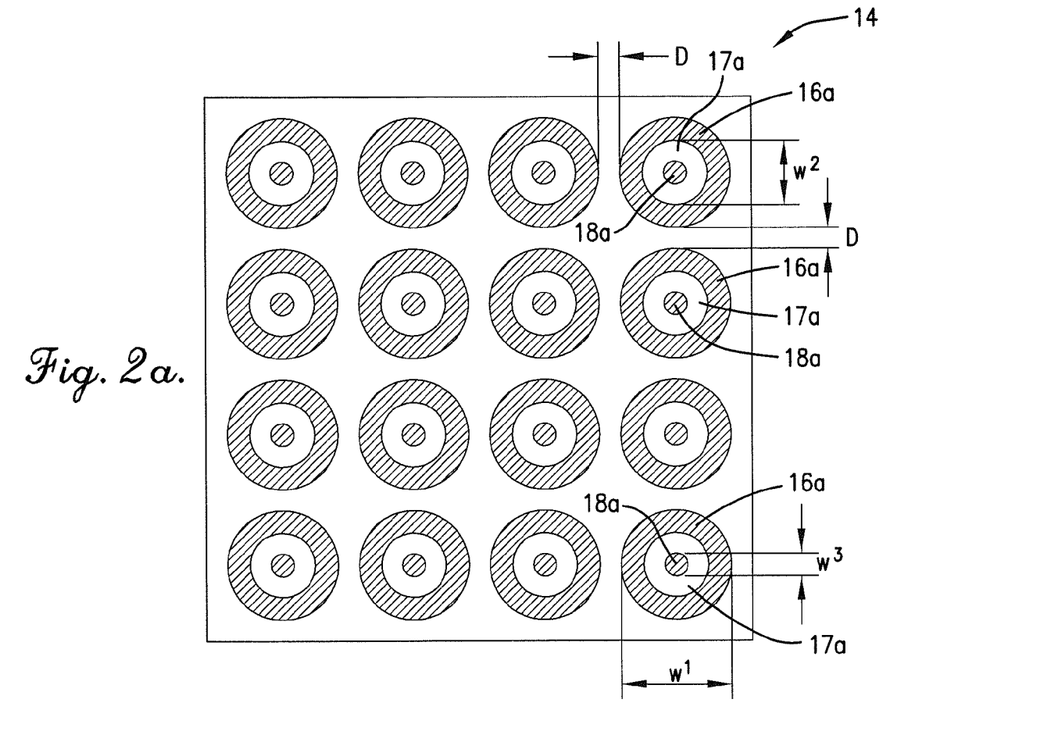
FIGS. 2a-d depict a section of each of four types of inventive masks.
Figure 2B:
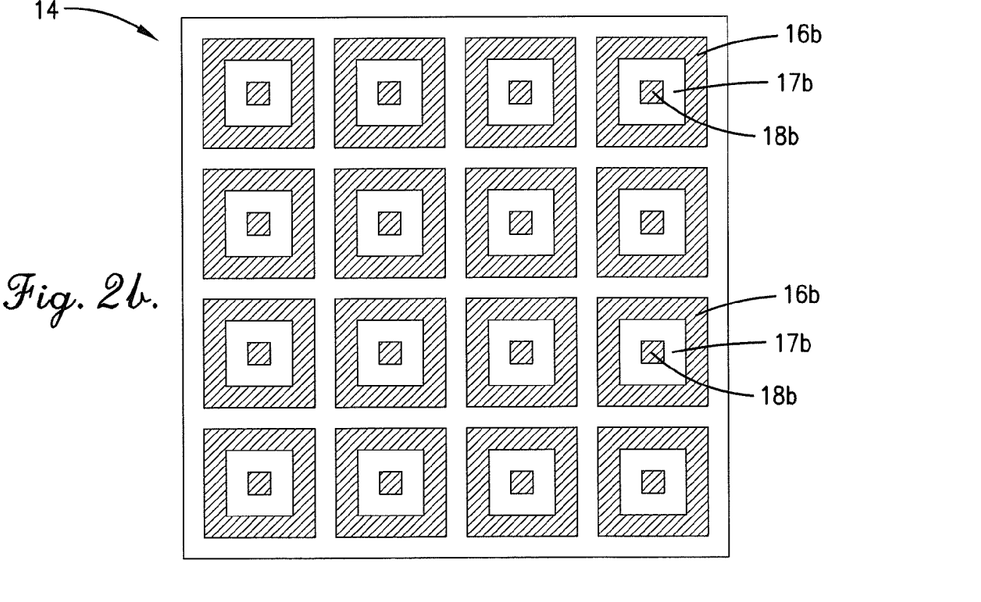
Figure 2C:
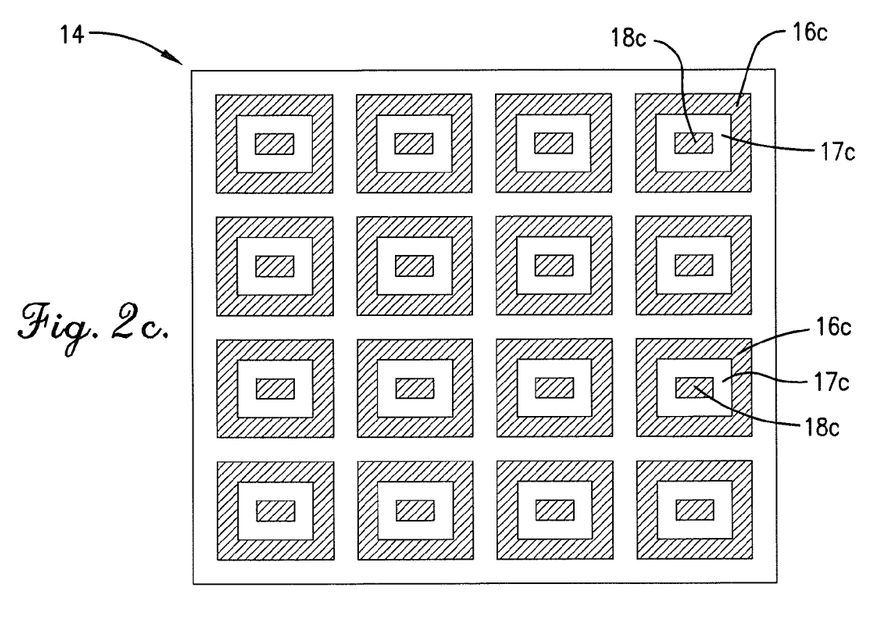
Figure 2D:
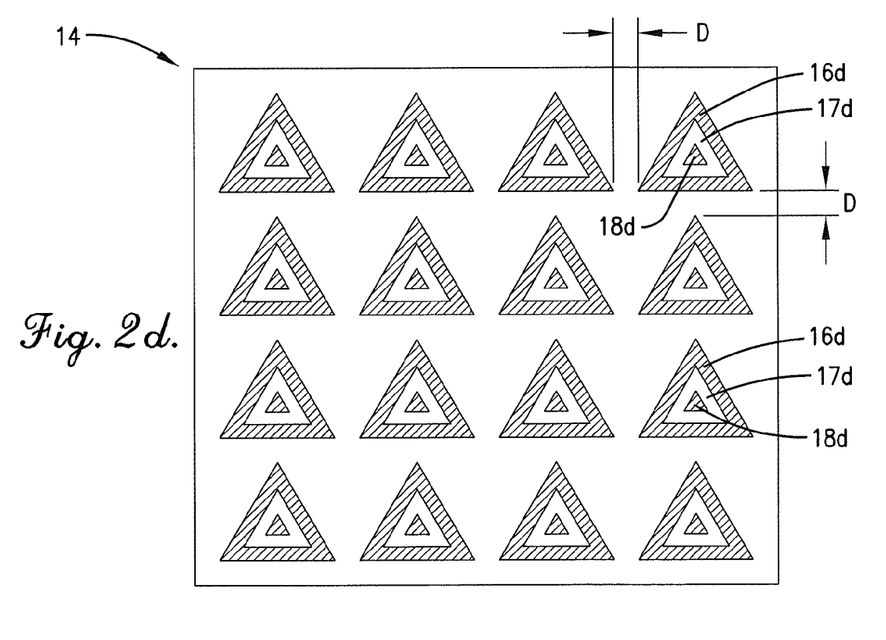

Referring to FIG. 1(a), a substrate 10, having a front surface 10a and a back surface 10b, is provided. Substrate 10 is preferably a silicon substrate (e.g., silicon wafer). That is, substrate 10 is at least about 90% silicon, preferably at least about 95% silicon, and more preferably about 100% silicon. Additionally, the substrate 10 desirably has a resistivity of less than about 50 Ω·cm, preferably less than about 10 Ω·cm, more preferably less than about 2 Ω·cm, even more preferably less than about 1 Ω·cm, and most preferably from about 0.5 Ω·cm to about 1 Ω·cm.

Optionally, although not shown in the figures, an intermediate layer (e.g., primer layer, described in more detail below) can be applied to the surface 10a by any conventional means for the particular layer. In a preferred method (and this is particularly preferred if the intermediate layer is a primer layer), the composition from which the intermediate layer is formed is applied to the front surface 10a of substrate 10 by spin-coating the composition at speeds of from about 500 rpm to about 4,000 rpm, and more preferably from about 1,500 to about 2,500 rpm, depending upon the desired etch geometry. The layer is then baked at a temperature of from about 50° C. to about 300° C., preferably in a two-stage bake with a first bake at a temperature of from about 60° C. to about 130° C. for about 1 minute, followed by a second bake at a temperature of from about 200° C. to about 280° C. for about 5 minutes. In instances where the intermediate layer is a primer layer, most of the primer layer is removed by solvent stripping, preferably by using PGMEA for about 30 seconds to about 90 seconds, and more preferably from about 50 seconds to about 60 seconds, leaving a monolayer of primer on the substrate.

A layer 12 of a composition is formed on the surface 10a (or on the intermediate layer, if present) by any conventional means, thus forming stack 11. Preferably, the composition is a photosensitive composition. As used herein, "photosensitive" means that a pattern can be defined in the layer 12 when it is exposed to about 1 J/cm² of energy.

In a preferred application method, the composition (described in more detail below) is spin coated onto the substrate at speeds of from about 1,000 rpm to about 4,000 rpm, and preferably from about 2,000 rpm to about 3,000 rpm, for about 60-180 seconds, and preferably about 120 seconds. The spin-coated composition is then baked at a temperature of from about 90° C. to about 150° C., and more preferably from about 100° C. to about 120° C., for about 60-180 seconds (preferably about 120 seconds) to form layer 12. The polymer solids level and spinning conditions are typically adjusted to achieve an average coating thickness after baking (as measured by an ellipsometer over 5 different points) of from about 0.1 µm to about 2.5 µm, and preferably from about 0.5 µm to about 1.0 µm. After baking, layer 12 functions as an etch layer in the inventive method.

A mask 14 is then positioned above layer 12. Mask 14 has a template pattern formed therein, and is shown in more detail in FIGS. 2a-2d. A typical mask 14 is a planar structure, formed of a rigid material, such as glass or quartz. Mask 14 has an average thickness of from about 0.007 in. to about 0.120 in., and preferably from about 0.05 in. to about 0.10 in.

As illustrated, mask 14 has a plurality of template "bands" 16a-16d formed therein, preferably in an array. The bands 16a-16d are shaped to achieve the cross-sectional shape that is desired in the outer wall of the final silicon tubes. For example, if cylindrical tubes are desired, then a circular cross-sectional shape is needed in the final tube, and the bands are circular, as are bands 16a in FIG. 2a. The bands can also be square (16b in FIG. 2b), rectangular (16c in FIG. 2c), triangular (16d in FIG. 2d), or any other desired shape. Additionally, because the tubes are hollow, each of bands 16a-d surrounds a corresponding opening template 18a-d. The respective shapes of opening templates 18a-d correspond to that of the respective band 16a-d that encompasses the opening template 18a-d (e.g., if band 16 is circular, then opening template 18 is circular).

The bands 16a-16d and opening templates 18a-d are designed to have a first % light transmission. The areas of the mask 14 that are not part of the bands 16a-16d or opening templates 18a-d have a second % light transmission and are designated as 17a-d in FIGS. 2a-2d. Any part of the surface of mask 14 that is not within the bands 16a-16d or opening templates 18a-d has this second % light transmission. The first and second % light transmissions are different from one another, thus creating areas where light can more easily pass through the mask 14, as well as areas where the light cannot easily (and preferably not at all) pass through the mask 14. The low- or no-light transmission areas are typically created by applying a UV-resistant material (e.g., chrome, black or other UV-resistant ink) to the areas where low- to no-light transmission is desired.

In a preferred embodiment, the first % light transmission is less than that of the second % light transmission. Preferably, the second % light transmission is at least about 80% greater, more preferably at least about 90% greater, and even more preferably at least about 95% greater than the first % light transmission. In such instances, it is preferred that the first % light transmission is less than about 5%, and more preferably less than about 0.1%, and that the second % light transmission is at least about 80%, and more preferably at least about 90%. Thus, as can be appreciated, in the preferred embodiment, bands 16a-16d and opening templates 18a-d are designed to prevent the passage of light through the mask 14. However, if desired, the above can be reversed, so that bands 16a-16d and opening templates 18a-d allow the passage of light through mask 14 while areas 17a-d prevent it.

In any instance, the bands 16a-16d are present in the mask 14 at an average density of from about 20,000 bands to about 20,000,000 bands per $cm^2$ of mask surface area, preferably from about 50,000 bands to about 3,000,000 bands per $cm^2$, and more preferably from about 100,000 bands to about 1,000,000 bands per $cm^2$ of mask surface area. The closest point between any two bands 16a-16d is preferably a distance "D" of less than about 50 µm, more preferably less than about 10 µm, and even more preferably less than about 1 µm.

The average maximum dimension or width "$W^1$" of any band 16a-16d is preferably from about 150 nm to about 50 µm, and more preferably from about 500 nm to about 30 µm. The areas 17a-d within the bands 16a-16d preferably have an average maximum dimension or width "$W^2$" of from about 50 nm to about 20 µm, and more preferably from about 500 nm to about 10 µm. The opening templates 18a-d preferably have an average maximum dimension or width "$W^3$" of from about 1 µm to about 10 µm, more preferably from about 3 µm to about 7 µm, and more preferably about 5 µm.

In an alternative embodiment, the bands 16a-d could instead be formed in two different processes, using two different masks. For example, a first mask could be used to form the bands 16a-d, followed by the above-described exposing, post-exposure baking, and developing. A second mask could then be used to form the opening templates 18a-d, followed by exposing, post-exposure baking, and developing. Thus, there would be two litho steps in this alternative embodiment. Additionally, opening templates 18a-d could be formed first, followed by bands 16a-d, if preferred.

In instances where the layer 12 is not formed from a photosensitive composition (i.e., layer 12 is non-photosensitive), an optional imaging layer(s) may be applied on top of the layer 12. Such optional imaging layers include photoresists and photosensitive hardmasks.

After the mask 14 is positioned above layer 12, the photosensitive layer (be it layer 12 or an optional imaging layer that has been applied onto layer 12) is then imaged by exposing it to UV light 20 with a wavelength of from about 150 nm to about 500 nm, and preferably from about 150 nm to about 365 nm (e.g., about 248 nm or about 365 nm). Suitable exposure doses are from about 100 $mJ/cm^2$ to about 500 $mJ/cm^2$, and preferably from about 200 $mJ/cm^2$ to about 300 $mJ/cm^2$. Exposure to light causes a photoacid generator (PAG) in layer 12 (or optional imaging layer) to generate an acid.

A post-exposure bake (PEB) followed by developing can then be performed on the silicon wafer. The PEB is preferably carried out at a temperature of from about 80° C. to about 200° C., and more preferably from about 100° C. to about 120° C. The PEB is preferably performed for about 1 minute to about 3 minutes, and more preferably for about 2 minutes. The acid generated by the PAG during light exposure initiates crosslinking of groups (e.g., epoxy groups) in layer 12 (or in the optional imaging layer) during the PEB. The exposed areas become substantially insoluble (e.g., less than about 1% by weight soluble, preferably less than about 0.05% soluble, and more preferably about 0% soluble) in typical solvent developers such as propylene glycol monomethyl ether acetate (PGMEA), methyl isoamyl ketone (MIAK), ethyl lactate, isopropyl alcohol, and ethyl acetoacetate. The unexposed areas remain soluble in these developers.

Development can be carried out by contacting the exposed layer 12 with organic solvents such as those selected from the group consisting of MIAK, ethyl lactate, ethyl acetoacetate, PGMEA, and isopropyl alcohol. Development can be performed by use of puddle dispense or dynamic dispense, with a preferred method being the use of ethyl lactate with a dynamic dispense for a period of about 90 seconds. Rinsing of the developed substrate can be performed using the developing solvent or using isopropyl alcohol, preferably for 30 seconds. A final bake is then performed at a temperature of from about 200° C. to about 230° C., and preferably at about 220° C., for a time period of from about 1 minute to about 5 minutes, preferably about 3 minutes. Because the unexposed areas (which correspond to bands 16a-16d and opening templates 18a-d; band 16a and opening template 18a are illustrated in FIG. 1) remain soluble in the developer, they are readily removed during developing to form recessed areas 22 (i.e., a pattern with bare silicon exposed; see FIG. 1(b)).

In an alternative embodiment, composition from which layer 12 is formed (or from which the imaging layer is formed, if present) is altered so that the exposed areas become soluble in the developer, and thus it is the exposed areas that can be removed by the developer rather than the unexposed areas. In this embodiment, the unexposed areas are substantially insoluble (as defined previously) in typical developers.

The post-develop stack 11' is then subjected to a wet silicon etch as illustrated in FIG. 1(c). Suitable wet etching materials include aqueous potassium hydroxide (KOH) solution and aqueous tetramethyl ammonium hydroxide (TMAH), depending on the desired etch rate. For a KOH etch, suitable etch conditions include a 30% aqueous KOH solution at a temperature of from about 50° C. to about 100° C., and preferably from about 70° C. to about 80° C. For a TMAH etch, suitable etch conditions include a 25% aqueous TMAH solution at a temperature of from about 60° C. to about 110° C., and preferably from about 70° C. to about 90° C. Substrate 10 can be placed vertically or horizontally during wet etching, depending upon the geometry of the etch bath and whether there is agitation. Etching can be performed for about 1 minute to about 60 minutes, and more preferably from about 5 minutes to about 25 minutes, depending on the desired etch depth and etch rate. After wet etching, "V-shaped" areas 24 are formed in substrate 10, thus creating the modified stack 11" shown in FIG. 1(d).

Although not shown in the figures, it's possible that residual layer 12 may remain on surface 10a. If desired, an optional etch mask (i.e., layer 12) removal can be performed. Suitable dry etch removal conditions include a plasma etch first, using $O_2$ etch, $O_2/CF_4$ etch, or $O_2/N_2$ etch, but most preferably an $O_2/N_2$ etch. The preferred $O_2$ gas flow is about 50 sccm, and the preferred $N_2$ flow is about 10 sccm. The preferred power is 400 W, and the preferred pressure is 10 mTorr.

It will be appreciated that the above describes only one possible manner to arrive at this point in the process, and the present invention is intended to cover wet etching in lieu of dry etching, as well as dry etching in lieu of wet etching. Additionally, it's possible that all layers would be dry etched, with no wet etching being carried out. The key is to remove the desired areas from the intermediate layer (if present), layer 12, and imaging layer (if present) so that the underlying silicon substrate surface 10a is exposed.

Following the wet silicon etch and optional dry etch (or other combination of etching that was carried out), the patterned silicon substrates are subjected to a photoassisted electrochemical etch (PEC). Suitable etchants for a PEC etch include about 3% to about 5% aqueous HF acid etchant, with the preferred concentration range being dependent upon the structure geometry. Optionally, surfactants may be added to the etchant. Suitable surfactants include those selected from the group consisting of Dynol™ 604 surfactant, Triton X-100 surfactant, and Kodak Photo-Flo 200 surfactant. Suitable surfactant concentrations are from about 0.025% to about 2% by weight, more preferably from about 0.04% to about 0.1% by weight, based upon the total weight of the etchant composition. The preferred type of surfactant and concentration range are dependent on structure geometry. PEC etch parameters include bias voltage, etch current, infrared radiant flux, infrared radiation wavelength, and etch time. Preferred bias voltages are from about 0.5 V to about 10 V, and preferably from about 3 V to about 5 V. The preferred etch current depends on the area of the active etch sites, but a preferred range is from about 0.01 A/cm$^2$ to about 2 A/cm$^2$, preferably from about 0.1 A/cm$^2$ to about 1 A/cm$^2$, and even more preferably from about 0.5 A/cm$^2$ to about 0.8 A/cm$^2$. Preferred infrared radiant fluxes are from 0.5 W/in$^2$ to 10 W/in$^2$, and preferably from about 0.5 W/in$^2$ to about 2 W/in$^2$. The preferred infrared radiation wavelength is about 880 nm, while the preferred PEC etch time is from about 1 hour to about 12 hours, depending on the desired tube length and the etch rate. The PEC etch can be repeated, if necessary/desired, depending upon final desired tube length. Optionally, if features created in the first PEC step require protection during subsequent PEC steps, an HF acid protective layer may be used.

Ultimately, the PEC process continues to transfer the pattern created by bands 16 down into the substrate 10. This results in the creation of tube precursors or "pre-tubes" 26 that are still connected to (i.e., integrally formed with) back surface 16b of substrate 10 (see FIG. 1(e)). These tube precursors 26 can then be separated from substrate 10 by any number of known methods to yield free-standing tubes 28. For example, a temporary wafer bonding process could be utilized, whereby a carrier wafer is bonded to the tube precursors 26. The back surface 16b is then removed, such as by backside grinding, after which the carrier wafer is removed, and free-standing tubes 28 remain. In another example, the tube precursors 26 could be covered with a protective material, and the back surface 16b could be etched away to leave free-standing tubes 28.

Inventive Tubes

Figure 3:
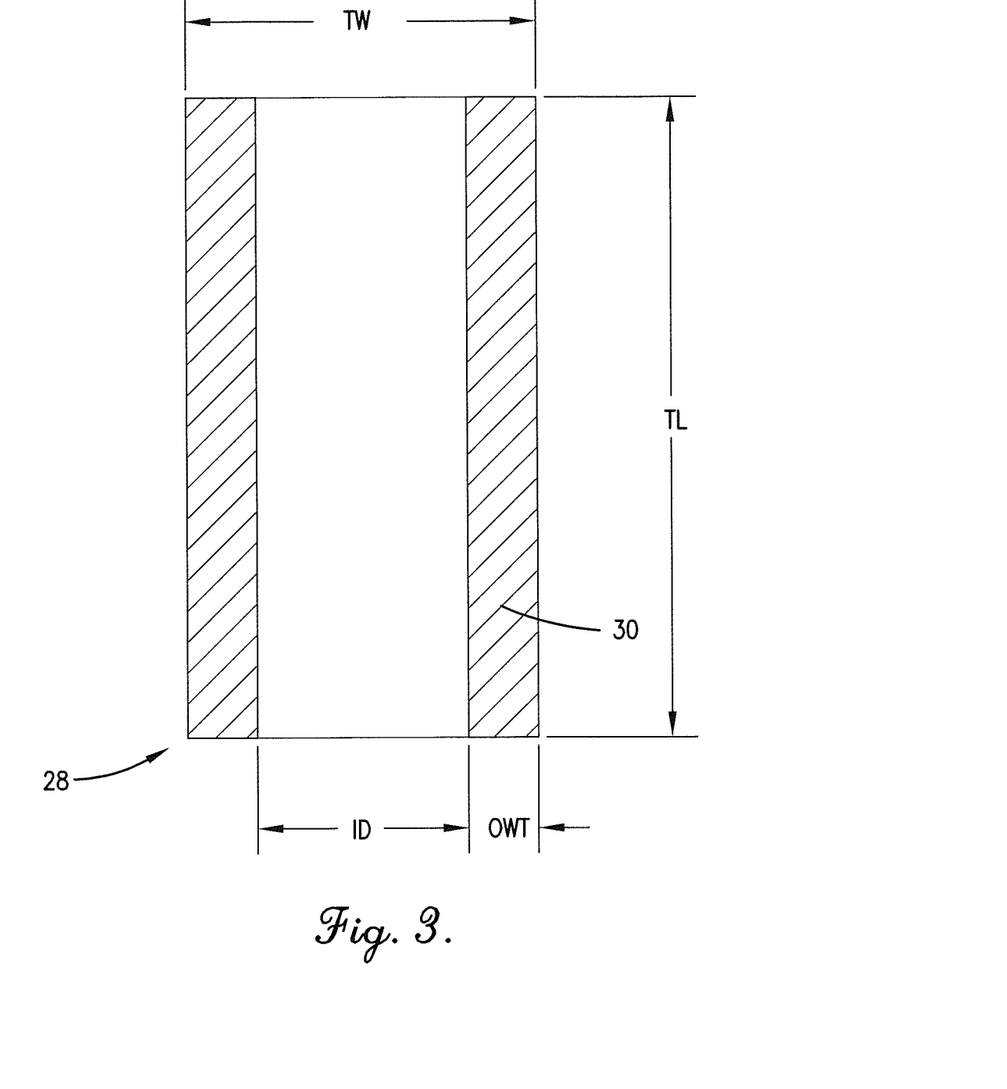
FIG. 3 illustrates the dimensions of a silicon tube according to the invention.

FIG. 3 is a schematic of a tube prepared according to the invention. Advantageously, these tubes will have an average tube length "TL" of less than about 500 µm, preferably from about 30 µm to about 250 µm, and more preferably from about 50 µm to about 150 µm. Additionally, the tubes formed according to the inventive method will have an average tube width "TW" of less than about 50 µm, preferably from about 150 nm to about 30 µm, and more preferably from about 500 nm to about 10 µm. As used herein, the tube width "TW" is the average maximum cross-sectional dimension.

The inventive tubes also have a high average aspect ratio [(TL)/(TW)], preferably at least about 2:1, more preferably from about 3:1 to about 100,000:1, and even more preferably from about 5:1 to about 500:1. The tubes will have an average outer wall 30 thickness "OWT" of at least about 50 nm, preferably at least about 500 nm, more preferably from about 50 nm to about 20 µm, and even more preferably from about 1 µm to about 5 µm. The tubes will have an average maximum cross-sectional opening dimension or width "ID" of from about 50 nm to about 20 µm, preferably from about 500 nm to about 10 µm, and more preferably from about 1 µm to about 5 µm. Additionally, in one embodiment, $W^1$ is approximately equal to TW+ID; $W^2$ is approximately equal to TW, and $W^3$ is approximately equal to ID. Finally, unlike prior art silicon tubes, the inventive tubes have straight (i.e., "non-wavy") outer walls 30.

Preferred Composition for Use in the Inventive Methods

Any compositions that have the above described properties and that are capable of functioning as described above can be used with the present invention. However, particularly preferred such compositions are described below.

1. Preferred Primer Layer Composition

Preferred primer layers are formed from primer layer compositions including a silane dispersed or dissolved in a solvent system. Aromatic and organo silanes are particularly preferred silanes for use in the primer layers of the invention. Furthermore, it is preferred that the silane include at least one (and more preferably 2-3) group per molecule of compound, or per repeat unit of polymer, that reacts with epoxy groups to form covalent bonds so that adhesion to a silicon substrate is very strong. One preferred such group is an amine group.

Preferred silanes include aminoalkoxysilanes, preferably from about $C_1$ to about $C_8$ alkoxys, more preferably from about $C_1$ to about $C_4$ alkoxys, and even more preferably from about $C_1$ to about $C_3$ alkoxys. Even more preferably, the aminoalkoxysilane is an aminoalkylalkoxysilane, preferably from about $C_1$ to about $C_8$ alkyls, more preferably from about $C_1$ to about $C_4$ alkyls, and even more preferably from about $C_1$ to about $C_3$ alkyls. Phenylaminoalkylalkoxysilanes are also preferred. Some examples of the foregoing include aminopropyltrimethoxysilane, aminopropyltriethoxysilane, N-phenylaminopropyltrimethoxysilane, N-phenylaminopropyltriethoxysilane, 3-glycidoxypropyltrimethoxysilane, 2-(3,4-epoxycyclohexyl)ethyltrimethoxysilane, and 3-mercaptopropyl-trimethoxysilane.

Other preferred silanes include phenylsilanes such as phenyltrimethoxysilane, phenyltrichlorosilane, phenyltriethoxysilane, phenyltriacetoxysilane, and diphenylsilanes such as diphenyldimethoxysilane, diphenyldichlorosilane, and diphenylsilanediol. The most preferred silanes include 2-phenylethyltrialkoxysilane, p/m-chlorophenyltrimethoxysilane, p/m-bromophenyltrimethoxysilane, (p/m-chloromethyl)phenyltrimethoxysilane, 2-(p/m-methoxy)phenylethyltrimethoxysilane, 2-(p/m-chloromethyl)phenylethyltrimethoxysilane, 3,4-dichlorophenyltrichlorosilane, 3-phenoxypropyltrichlorosilane, 3-(N-phenylamino)propyltrimethoxysilane, and 2-(diphenylphosphino)ethyltriethoxysilane.

Some preferred silanes for use in the present invention can also be represented by the general formula where:

A=

B= wherein:
each of i, j, and k is individually selected from the group consisting of 0 and 1, and if one of i and j is 1, then the other of i and j is 0;
each $R^4$ is individually selected from the group consisting of hydrogen, the halogens, $C_1$-$C_8$ (preferably $C_1$-$C_4$) alkyls, $C_1$-$C_8$ (preferably $C_1$-$C_4$) alkoxys, $C_1$-$C_8$ (preferably $C_1$-$C_4$) haloalkyls, aminos, and $C_1$-$C_8$ (preferably $C_1$-$C_4$) alkylaminos;
each $R^5$ is individually selected from the group consisting of $C_1$-$C_8$ (preferably $C_1$-$C_4$) aliphatic groups;
each $R^6$ is individually selected from the group consisting of hydrogen and haloalkyls (preferably $C_1$-$C_8$, more preferably $C_1$-$C_4$);
each X is individually selected from the group consisting of halogens, hydroxyls, $C_1$-$C_4$ alkoxys and $C_1$-$C_4$ carboxyls;
Y is selected from the group consisting of oxygen and sulfur;
Z is selected from the group consisting of nitrogen and phosphorus; and
each d is individually selected from the group consisting of 0 and 1.

An effective primer layer composition according to the invention is a mixture of a diphenyldialkoxysilane (e.g., diphenyldimethoxysilane) and a phenyltrialkoxysilane, (e.g., phenyltrimethoxysilane) or, even more preferably, a mixture of diphenylsilanediol and phenyltrimethoxysilane in a solution of 1-methoxy-2-propanol or 1-propoxy-2-propanol with from about 10-60% by weight water. A particularly effective primer layer composition for photosensitive layers comprising a poly(styrene-co-acrylonitrile) polymer is an alcohol and water solution containing from about 0.1-1.0% (preferably from about 0.25-0.5%) by weight diphenylsilanediol and from about 0.1-1.0% (preferably from about 0.25-0.5%) by weight of phenyltrimethoxysilane. Upon heating, diphenylsilanediol and phenylsilanetriol (the hydrolysis product of phenyltrimethoxysilane) condense to form siloxane bonds and establish a three-dimensional silicone coating layer on the substrate.

Another preferred silane has the formula wherein:
each $R^7$ is individually selected from the group consisting of hydrogen, the halogens, $C_1$-$C_8$ (preferably $C_1$-$C_4$) alkyls, $C_1$-$C_8$ (preferably $C_1$-$C_4$) alkoxys, $C_1$-$C_8$ (preferably $C_1$-$C_4$) haloalkyls, aminos, and $C_1$-$C_8$ (preferably $C_1$-$C_4$) alkylaminos; and each $R^8$ is individually selected from the group consisting of $C_1$-$C_8$ (preferably $C_1$-$C_4$) aliphatic groups.

Silanes having this structure are not only compatible with styrene-containing copolymers, but they are also reactive with ester, benzyl chloride, and/or epoxy groups, and they are excellent adhesion promoters. One particularly preferred silane within the scope of this formula is This silane is 3[N-phenylamino]propyltrimethoxysilane (mentioned above), and it is commercially available from Lancaster Synthesis and Gelest Corporation.

The silane should be included in the primer layer composition at a level of from about 0.1% to about 3% by weight, preferably from about 0.2% to about 2% by weight, and even more preferably from about 0.5% to about 1% by weight, based upon the total weight of solids in the primer layer composition taken as 100% by weight.

The solvent system utilized in the primer layer composition should have a boiling point of from about 100° C. to about 220° C., and preferably from about 140° C. to about 180° C. The solvent system should be utilized at a level of from about 30% to about 99.9% by weight, and preferably from about 40% to about 80% by weight, based upon the total weight of the primer layer composition taken as 100% by weight. Preferred solvent systems include a solvent selected from the group consisting of methanol, ethanol, isopropanol, butanol, 1-methoxy-2-propanol, ethylene glycol monomethyl ether, propylene glycol propyl ether, and 1-propoxy-2-propanol, and mixtures thereof. In one preferred embodiment, water is included in the solvent system at a level of from about 20% to about 60% by weight, and preferably from about 40% to about 60% by weight, based upon the total weight of the primer layer composition taken as 100% by weight.

The primer layer composition can also include a catalyst. Suitable catalysts include any inorganic or organic acid (e.g., hydrochloric acid, sulfuric acid, phosphoric acid, acetic acid) or an inorganic or organic base (e.g., potassium hydroxide, TMAH, ammonia, amines). The catalyst is preferably present in the primer layer composition at levels of from about 0.01% to about 0.5% by weight, more preferably from about 0.1% to about 0.3% by weight, and even more preferably from about 0.02% to about 0.03% by weight, based upon the total weight of solids in the primer layer composition taken as 100% by weight.

Finally, the primer layer can also include a number of optional ingredients, such as a surfactant. In one embodiment, from about 100 ppm to about 400 ppm of a surfactant such as FC4430 (available from 3M) or Triton X-100 (available from 3M) can be added to make a uniform primer coating that is defect-free.

Preferred primer compositions are disclosed in U.S. Pat. No. 7,709,178, incorporated by reference herein, with a preferred commercial product being available under the name ProTEK® PSB primer (Brewer Science, Inc.).

2. Preferred Composition for Forming Layer 12

As discussed previously, it is preferred that a photosensitive composition be used to form layer 12. A preferred photosensitive composition comprises a first polymer that is a copolymer comprising recurring styrene monomers and acrylonitrile monomers.

Preferred styrene monomers have the formula

Preferred acrylonitrile monomers have the formula

In each of the above formulas (I) and (II):
each $R^1$ is individually selected from the group consisting of hydrogen and $C_1$-$C_8$ (and preferably $C_1$-$C_4$) alkyls; and
each $R^2$ is individually selected from the group consisting of hydrogen, $C_1$-$C_8$ (and preferably $C_1$-$C_4$) alkyls, and $C_1$-$C_8$ (and preferably $C_1$-$C_4$) alkoxys.

The first polymer preferably comprises from about 50% to about 90% by weight of monomer (I), more preferably from about 60% to about 80% by weight of monomer (I), and even more preferably from about 70% to about 75% by weight of monomer (I). The first polymer preferably comprises from about 10% to about 50% by weight of monomer (II), more preferably from about 20% to about 40% by weight of monomer (II), and even more preferably from about 25% to about 30% by weight of monomer (II). Each of the above percentages by weight is based upon the total weight of the first polymer taken as 100% by weight.

It is preferred that the first polymer have a weight average molecular weight of from about 10,000 Daltons to about 80,000 Daltons, preferably from about 20,000 Daltons to about 60,000 Daltons, and even more preferably from about 30,000 Daltons to about 50,000 Daltons.

Monomers other than monomers (I) and (II) can also be present in the first polymer, if desired. When other monomers are present, the combined weight of monomers (I) and (II) in the polymer is preferably at least about 60% by weight, and more preferably from about 70% to about 90% by weight, based upon the total weight of the first polymer taken as 100% by weight. Examples of suitable other monomers include those having functional groups that can react with groups in the primer layer for achieving chemical bonding between the two layers. These monomers may have, by way of example, haloalkyl (e.g., benzyl chloride, 2-chloroethyl methacrylate), ester (methacrylates, acrylates, maleates, fumarates, isocyanates), or anhydride functional groups, which react readily with functional groups such as hydroxyl, amino, or oxiranyl groups that can be present in the primer layer.

The first polymer should be included in the photosensitive layer composition at a level of from about 30% to about 70% by weight, and preferably from about 50% to about 65% by weight, based upon the total weight of solids in the photosensitive layer composition taken as 100% by weight.

The second polymer present in the composition comprises recurring monomers having one or more epoxy groups per monomer, and preferably, the polymer comprises monomers having at least two epoxy groups per monomer. In a preferred embodiment, this second polymer also comprises monomers comprising a phenolic group. The phenolic group can be on separate monomers, or it can be included on the same monomer as the epoxy groups.

In an alternative embodiment, instead of providing epoxy groups via a blend with a second polymer, the first polymer can further comprise a monomer (III) comprising at least one epoxy group. In this embodiment, the first polymer preferably comprises from about 35% to about 75% by weight of monomer (I), more preferably from about 40% to about 70% by weight of monomer (I), and even more preferably from about 50% to about 65% by weight of monomer (I). The first polymer preferably comprises from about 20% to about 40% by weight of monomer (II), more preferably from about 25% to about 35% by weight of monomer (II), and even more preferably from about 25% to about 30% by weight of monomer (II). Finally, the first polymer preferably comprises from about 5% to about 15% by weight of monomer (III), more preferably from about 6% to about 12% by weight of monomer (III), and even more preferably from about 8% to about 10% by weight of monomer (III). Each of the above percentages by weight is based upon the total weight of the first polymer taken as 100% by weight.

But, in embodiments where a second polymer is included to provide epoxy groups, the second polymer preferably comprises from about 15% to about 30% by weight epoxy groups, and more preferably from about 20% to about 25% by weight of epoxy groups. In embodiments where a phenolic group is present, the polymer preferably comprises from about 40% to about 70% by weight of the phenolic group, and more preferably from about 50% to about 60% by weight of the phenolic group. Each of the above percentages by weight is based upon the total weight of the second polymer taken as 100% by weight.

It is preferred that the second polymer have a weight average molecular weight of from about 300 Daltons to about 10,000 Daltons, preferably from about 500 Daltons to about 5,000 Daltons, and even more preferably from about 1,000 Daltons to about 2,000 Daltons.

Preferred polymers for use as the second polymer in the photosensitive composition include those selected from the group consisting of epoxy phenol novolac resins (e.g., DEN 431, Dow Chemical), epoxy bisphenol A/F resins (e.g., DER 353, Dow Chemical), epoxy cresol novolac resins (e.g., ECN 1299, Ciba Geigy), epoxy bisphenol A resins (e.g., EPON 825, Dow Chemical), epoxy bisphenol A novolac resins (EPON SU-8, Dow Chemical), and mixtures thereof.

Monomers other than monomers containing epoxy and/or phenolic groups can also be present in the second polymer, if desired, provided that the epoxy quantities discussed above are achieved. Examples of suitable other monomers include those discussed above with respect to the first polymer.

The second polymer should be included in the photosensitive layer composition at a level of from about 20% to about 60% by weight, and preferably from about 25% to about 40% by weight, based upon the total weight of solids in the photosensitive layer composition taken as 100% by weight.

The photosensitive composition will also comprise a photoacid generator (PAG). The PAG generates a strong acid or superacid when exposed to actinic radiation such as UV light. Examples of suitable PAGs include those selected from the group consisting of triarylsulfonium hexafluoroantimonate, triarylsulfonium hexafluoro-phosphates (e.g., UVI6976, Dow Chemical), diaryliodonium hexafluoroantimonate, diaryliodonium hexafluorophosphate, where each $R^3$ is individually selected from the group consisting of $C_3H_7$, $C_8H_{17}$, $CH_3C_6H_4$, and camphor. The PAGs of formulas (IV) and (V) are sold by Ciba Specialty Chemicals as The CGI 13XX Family and The CGI 26X Family, respectively.

The PAG should be included in the photosensitive composition at a level of from about 2% to about 10% by weight, and preferably from about 5% to about 8% by weight, based upon the total weight of solids in the photosensitive composition taken as 100% by weight.

The solvent system utilized in the photosensitive composition should have a boiling point of from about 120° C. to about 200° C., and preferably from about 130° C. to about 180° C. The solvent system should be utilized at a level of from about 70% to about 95% by weight, and preferably from about 80% to about 90% by weight, based upon the total weight of the photosensitive composition taken as 100% by weight. Preferred solvent systems include a solvent selected from the group consisting of methyl isoamyl ketone, di(ethylene glycol)dimethyl ether, propylene glycol monomethyl ether acetate, ethyl lactate, cyclohexanone, and mixtures thereof.

Preferred photosensitive compositions are disclosed in U.S. Pat. No. 7,709,178, referenced previously, as well as in U.S. Pat. No. 7,695,890, incorporated by reference herein. A preferred commercial product is the ProTEK® B family of materials (Brewer Science, Inc.).

EXAMPLES

The following examples set forth preferred methods in accordance with the invention. It is to be understood, however, that these examples are provided by way of illustration and nothing therein should be taken as a limitation upon the overall scope of the invention.

Example 1

Production of Orderly Array of Microscale Silicon Pores

A special mask with 4-μm circles was designed. Silicon substrates with low resistivity (1-2 Ω·cm) were used. The silicon substrate was first coated with ProTEK® PSB primer material (Brewer Science, Inc., Rolla, Mo.) at 1,000 rpm and 1,000 rpm/sec for 60 seconds. The primer underlayer was subjected to a two-stage bake, first at 110° C. for 60 seconds and then at 220° C. for 5 minutes. The primer layer was then solvent-stripped by use of a 20-second puddle of PGME (Sigma-Aldrich, St. Louis, Mo.). The silicon wafer with primer layer was then spin dried at 2,000 rpm and 10,000 rpm/sec for 20 seconds. This wafer was then spin-coated with diluted ProTEK® PSB material (11.5% solids, Brewer Science, Inc., Rolla, Mo.) at 1,500 rpm and 1,000 rpm/sec for 60 seconds. The coated wafer was then baked at 110° C. for 120 seconds. The substrate was then exposed on a SUSS mask aligner (broadband exposure at 250 mJ/cm$^2$ measured at 365 nm), followed by post-exposure bake (PEB) at 110° C. for 2 minutes. Following the PEB, the substrate was developed using ethyl lactate (Sigma-Aldrich, St. Louis, Mo.) for a total of 90 seconds (dynamic dispense, with 5-second on/off dispense). The developed wafer was rinsed with isopropyl alcohol (Sigma-Aldrich, St. Louis, Mo.) for 30 seconds, and a final bake was performed at 220° C. for 3 minutes.

A 30% aqueous KOH solution was used as an etchant at 75° C. The patterned substrates were subjected to KOH etching for 5 minutes with horizontal placement of wafers during etching. Etching was performed with agitation (etchant was stirred via magnetic stirring during etching). The KOH-etched wafers were rinsed with deionized water and dried in an oven at 50-70° C.

The etched substrates were then subjected to a photoassisted electrochemical etch (PEC) using an in-house tool. The PEC etch conditions were: infrared radiant flux 1.25 W/in$^2$, infrared wavelength 880 nm, etch current at 0.14-0.15 A, and bias voltage at 3.99 V. Diluted, 5%, aqueous hydrofluoric acid (600 grams of distilled water with 65.7 grams of 49% aqueous HF, Sigma-Aldrich, St. Louis, Mo.) with 0.5 ml (0.08% of total HF acid volume) of Dynol™ 604 surfactant (Air Products, Allentown, Pa.) was used as an etchant.

The KOH-etched wafers that were subjected to a 2-hour PEC etch produced silicon pores that were 3.25 µm wide and 83.76 µm deep. These pores were not branched. PEC-etched substrates did not exhibit any residue formation on the surface.

Figure 4:
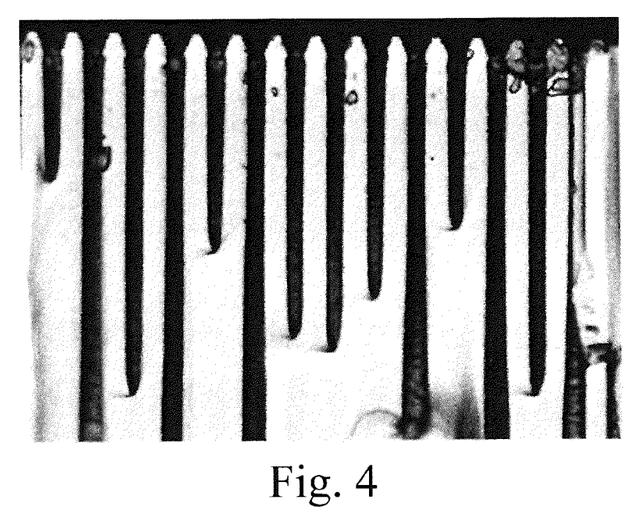
FIG. 4 is a scanning electron microscope (SEM) photograph (1,500×) showing a cross-sectional view of the silicon micropores created in Example 1.

Some KOH-etched wafers were further subjected to an O$_2$ plasma etch step (7 minutes of O$_2$ with a low-pressure N$_2$ strike for 8 minutes). O$_2$ gas flow was 50 sccm, N$_2$ flow was 10 sccm. Power was 400 W, and pressure was 10 mTorr. After plasma etching, the wafers underwent a 3.5-hour PEC etch. These substrates produced silicon pores that were 3.69 µm wide and 120 µm deep. These pores were not branched. PEC-etched substrates did not exhibit any residue formation on the surface. FIG. 4 shows the micropores created using this method (note: cleavage planes are not parallel to pattern planes, giving the illusion of pores having variable depth).

Example 2

Production of Orderly Array of Microscale Silicon Tubes

A special mask with 20-µm rings and 5 micron dots was designed to create the outer and inner walls of the tubes, respectively. Silicon substrates with low resistivity (1-2 Ω·cm) were used. Without the use of ProTEK® PSB primer, the silicon wafer was then spin-coated with diluted ProTEK® PSB material (5.75% solids, Brewer Science, Rolla, Mo.) at 1,500 rpm and 1,000 rpm/s for 60 seconds. The coated wafer was then baked at 110° C. for 120 seconds. The substrate was exposed to the outer wall pattern on a SUSS mask aligner (broadband exposure at 250 mJ/cm$^2$, measured at 365 nm), followed by post-exposure bake (PEB) at 110° C. for 2 minutes. Following the PEB, the substrate was developed using ethyl lactate (Sigma-Aldrich, St. Louis, Mo.) for a total of 90 seconds (dynamic dispense, with 5-second on/off dispense). The developed wafer was rinsed with isopropyl alcohol (Sigma-Aldrich, St. Louis, Mo.) for 30 seconds, and a final bake was performed at 220° C. for 3 minutes.

A 25% aqueous TMAH solution in the presence of 0.1 wt. % Triton X-100 surfactant was used as an etchant at 80° C. The patterned substrates were subjected to TMAH/triton etching for 25 minutes, with vertical placement of the wafers during etching. Etching was performed with agitation (etchant was stirred via magnetic stirring during etching). The TMAH-etched wafers were rinsed with deionized water and dried at room temperature.

The etched substrates were further subjected to an O$_2$ plasma etch step (7 minutes of O$_2$ including a low-pressure N$_2$ strike). O$_2$ gas flow was 50 sccm, and N$_2$ flow was 10 sccm. Power was 400 W, and the pressure was 10 mTorr.

For the second lithography step, the substrate was then re-coated using ProTEK® PSB material (5.75% solids, Brewer Science, Inc., Rolla, Mo.) in the absence of ProTEK® PSB primer, using the exact same lithography processes and subsequent etch processes. For the second lithography step, the inner wall pattern was used. A TMAH etch step was then used to create the inner wall in the same manner as the first wet etch step. These wafers were then subjected to plasma etch in the same manner as first dry etch step.

The plasma-etched wafers were then subjected to a photoassisted electrochemical etch (PEC) using an in-house tool. The PEC etch conditions were: infrared radiant flux 1.25 W/in$^2$, infrared wavelength 880 nm, etch current at 0.14 A, and bias voltage at 3.99 V. Diluted 3.5% aqueous hydrofluoric acid (605 grams of distilled water with 45 grams of 49% aqueous HF, Sigma-Aldrich, St. Louis, Mo.) with 0.28 gm of Triton X-100 surfactant (Sigma-Aldrich, St. Louis, Mo.) was used as an etchant. PEC etch was conducted at room temperature.

Figure 5:
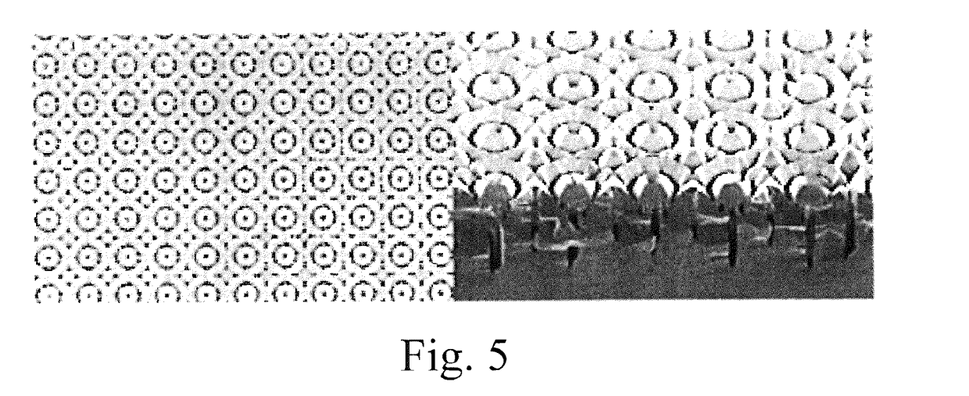
FIG. 5 is an SEM photograph (2,000×, plan view and right is cross-sectional view) of the silicon micro-scale tubes (16 microns in diameter by 27 microns in length) made in Example 2.

The plasma-etched wafers that were subjected to a 1-hour PEC etch produced silicon micro-scale tubes that were 16.0 µM in outer diameter and 27.0 µm in length (FIG. 5). These tubes were not branched. The PEC-etched substrates did not exhibit any residue formation on the surface.

Example 3

Production of Orderly Array of Microscale Silicon Tubes

A special mask with 25-µm rings and 5 micron dots was designed to simultaneously create the outer and inner walls of the tubes, respectively. Silicon substrates with low resistivity (1-2 Ω·cm) were used. ProTEK® PSB primer was used as an underlayer. The silicon wafer was spin-coated with diluted ProTEK® PSB primer (Brewer Science, Inc., Rolla, Mo.) at 2,500 rpm and 10,000 rpm/sec for 60 seconds. The coated wafer was then baked at 110° C. for 60 seconds, followed by 220° C. for 5 minutes. The primed wafer was solvent stripped using PGMEA for 52 seconds. The silicon wafer was spin-coated with diluted ProTEK® PSB material (5.75% solids, Brewer Science, Inc., Rolla, Mo.) at 2,500 rpm and 10,000 rpm/sec for 60 seconds. The coated wafer was baked at 110° C. for 120 seconds. The substrate was then exposed to create both outer and inner wall patterns on a SUSS mask aligner (broadband exposure at 250 mJ/cm$^2$ measured at 365 nm), followed by post-exposure bake (PEB) at 110° C. for 2 minutes. Following the PEB, the substrate was developed using ethyl lactate (Sigma-Aldrich, St. Louis, Mo.) for a total of 90 seconds (dynamic dispense with 5-second on/off dispense). The developed wafer was rinsed with isopropyl alcohol (Sigma-Aldrich, St. Louis, Mo.) for 30 seconds, and a final bake was performed at 220° C. for 3 minutes.

A 25% aqueous TMAH solution in the presence of 0.1 wt. % Triton X-100 surfactant was used as an etchant at 80° C. The patterned substrates were subjected to TMAH/triton etching for 25 minutes, with vertical placement of wafers during etching. Etching was performed with agitation (etchant was stirred via magnetic stirring during etching). The TMAH-etched wafers were rinsed with deionized water and dried at room temperature.

No plasma dry etch was used after wet TMAH etching. The TMAH-etched wafers were subjected to PEC etching using an in-house tool. The PEC etch conditions were: infrared radiant flux 1.25 W/in$^2$, infrared wavelength 880 nm, etch current at 0.14 A, and bias voltage at 3.99 V. Diluted 3.5% aqueous hydrofluoric acid (605 grams of distilled water with 45 grams of 49% aqueous HF, Sigma-Aldrich, St. Louis, Mo.) with 0.28 gm of Triton X-100 surfactant (Sigma-Aldrich, St. Louis, Mo.) was used as an etchant. The PEC etch was conducted at room temperature.

Figure 6:
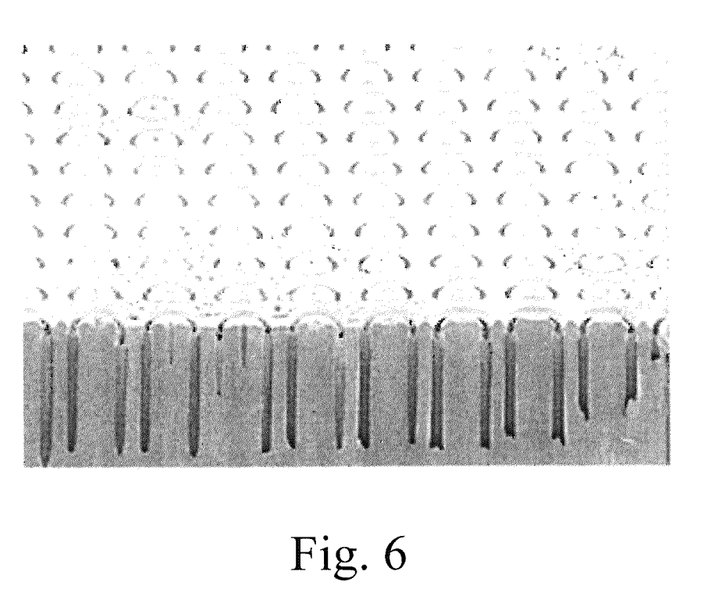
FIG. 6 is an SEM (1,000×) of a cross-sectional view of the silicon tubes (25 microns in diameter by 58 microns in length) prepared in Example 3.

The plasma-etched wafers that were subjected to a 2.5-hour PEC etch produced silicon micro-scale tubes that were 25.0 µm in outer diameter and 58.0 µm in length (FIG. 6). These tubes were not branched. PEC-etched substrates did not exhibit any residue formation on the surface.

We claim:

1. A method of forming silicon tubes, said method comprising:
   providing a silicon substrate having a surface;
   optionally forming an intermediate layer on said surface;
   forming an etch layer of a composition on said substrate surface, or on said intermediate layer, if present;
   optionally forming an imaging layer on said etch layer;
   selectively exposing said etch layer, or said imaging layer, if present, to light to form bands in the etch layer or imaging layer, if present, that are chemically different from the remainder of the etch layer or imaging layer, if present;
   removing areas of said etch layer or imaging layer, if present, yielding a pattern in the etch layer or imaging layer, if present; and
   transferring the pattern into the substrate so as to form silicon tubes from said substrate.

2. The method of claim 1, wherein said removing comprises a process selected from the group consisting of:
   developing said etch layer or imaging layer, if present; and
   etching said etch layer or imaging layer, if present.

3. The method of claim 1, wherein an imaging layer is present, and said removing comprises simultaneous removal of areas of said etch layer and said imaging layer.

4. The method of claim 1, wherein an imaging layer is present, and said removing comprises sequential removal of areas of said etch layer and said imaging layer.

5. The method of claim 1, wherein said bands have a shape selected from the group consisting of circular, square, rectangular, triangular, and combinations of the foregoing.

6. The method of claim 1, wherein said selectively exposing comprises positioning a mask over said etch layer or imaging layer, if present, said mask comprising a pattern of template bands corresponding to said bands.

7. The method of claim 6, wherein said mask comprises an array of template bands.

8. The method of claim 6, wherein said template bands are present in said mask at an average density of from about 20,000 template bands to about 20,000,000 template bands per cm$^2$ of mask surface area.

9. The method of claim 1, wherein said template bands prevent light from being exposed to said etch layer or said imaging layer, if present, at areas below said template bands, which correspond to said bands.

10. The method of claim 9, said mask further comprising opening templates that are encompassed by said template bands, said opening templates preventing light from being exposed to said etch layer or said imaging layer, if present, at areas below said opening templates.

11. The method of claim 10, wherein the selectively exposing comprises causing those areas that are exposed to light to crosslink, while the bands and the areas on said etch layer or imaging layer, if present, that are below the opening templates remain uncrosslinked.

12. The method of claim 11, wherein said developing removes said bands and said areas on said etch layer or imaging layer, if present, that are below the opening templates from said layer.

13. The method of claim 12, wherein said transferring said pattern comprises etching said substrate.

14. The method of claim 13, said silicon substrate having a back surface, wherein said etching transfers said bands and said areas on said etch layer or imaging layer, if present, that are below the opening templates down into said silicon substrate, thus causing the silicon tubes to remain on, and be attached to, said back surface of said silicon substrate.

15. The method of claim 13, further comprising separating said silicon tubes from said back surface.

16. The method of claim 1, wherein said silicon tubes have an average length of less than about 500 µm.

17. The method of claim 1, wherein said silicon tubes have an average maximum cross-sectional width of less than about 50 µm.

18. The method of claim 1, wherein said silicon tubes have an average wall thickness of at least about 50 nm.

19. The method of claim 1, wherein said composition comprises a photoacid generator and a first polymer comprising:

wherein:
each $R^1$ is individually selected from the group consisting of hydrogen and $C_1$-$C_8$ alkyls; and
each $R^2$ is individually selected from the group consisting of hydrogen, $C_1$-$C_8$ alkyls, and $C_1$-$C_8$ alkoxys.

20. The method of claim 19, said composition further comprising a second polymer comprising recurring monomers comprising epoxy groups.

21. The method of claim 19, said first polymer further comprising:

(III) a monomer comprising at least one epoxy group.

* * * * *